United States Patent [19]

Kawakyu et al.

[11] Patent Number: 5,229,319
[45] Date of Patent: Jul. 20, 1993

[54] METHOD FOR PRODUCING COMPOUND SEMICONDUCTORS AND APPARATUS THEREFOR

[75] Inventors: Yoshito Kawakyu, Kanagawa; Hironori Ishikawa, Tokyo; Masahiro Sasaki; Masao Mashita, both of Kanagawa, all of Japan

[73] Assignee: Kabushiki Kaisha Toshiba, Kawasaki, Japan

[21] Appl. No.: 618,928

[22] Filed: Nov. 28, 1990

[30] Foreign Application Priority Data

Nov. 30, 1989 [JP] Japan .................. 1-310972
Feb. 28, 1990 [JP] Japan .................. 2-47511

[51] Int. Cl.$^5$ ............... H01L 21/00; H01L 21/02; H01L 21/20; H01L 21/36
[52] U.S. Cl. .................. 437/81; 437/89; 437/233; 437/234; 437/235; 437/245; 148/DIG. 56; 148/DIG. 65
[58] Field of Search ............ 437/81, 89, 90, 225, 437/228, 233, 234, 235, 236, 240, 245; 148/DIG. 56, DIG. 65

[56] References Cited

U.S. PATENT DOCUMENTS

| 4,352,713 | 10/1982 | Morita ................. 437/81 |
| 4,369,031 | 1/1983 | Goldman et al. ......... 437/81 |
| 4,388,342 | 6/1983 | Suzuki et al. .......... 437/81 |
| 4,517,220 | 5/1985 | Rose ................... 437/81 |
| 4,801,474 | 1/1989 | Saitoh et al. .......... 437/234 |
| 4,833,103 | 5/1989 | Agostinelli et al. ..... 437/234 |
| 4,840,921 | 6/1989 | Matsumoto .............. 437/89 |
| 4,859,625 | 8/1989 | Matsumoto .............. 437/81 |

FOREIGN PATENT DOCUMENTS

| 0249315 | 12/1985 | Japan ................. 437/234 |
| 0034921 | 2/1986 | Japan . |
| 0280611 | 12/1986 | Japan ................. 437/81 |
| 0166214 | 7/1988 | Japan ................. 437/81 |

OTHER PUBLICATIONS

Ishikawa, KrF Excimer Laser Irradiation Effect on GaAs Atomic Layer Epitaxy, Jap. J. of Appl. Phys., vol. 28, No. 12, Dec. 1989, pp. L2327-L2329.

Ozeki, New Approach to the atomic layer epitaxy of GaAs using a fast gas stream, Appl. Phys. Lett. 53(16), Oct. 1988, pp. 1509-1511.

Usui, GaAs Atomic Layer Epitaxy by Hydride VPE, Jap. J. of Appl. Phys., vol. 25, No. 3, Mar. 1986, pp. L212-L214.

Sze, S., VLSI Technology, p. 270, McGraw-Hill, 1983.

*Primary Examiner*—Brian E. Hearn
*Assistant Examiner*—B. Everhart
*Attorney, Agent, or Firm*—Foley & Lardner

[57] ABSTRACT

Disclosed is a method of selective chemical vapor deposition for selectively forming thin films of a semiconductor, dielectric or metal on a semiconductor by providing a mask of $SiO_2$ having a plurality of openings in various forms on the substrate, wherein a trimethyl gallium (TMG) gas as a Group III material, 10% hydrogen-based arsine ($AsH_3$) gas as a Group V material, and 500 ppm hydrogen-based disilane ($Si_2H_6$) gas as an n-type impurity material are alternately supplied onto the substrate, and each supply amount of the material gases is controlled at a value to obtain a film growth rate for forming the corresponding monoatomic layer or monomolecular layer to each material at each opening. Also disclosed is an apparatus for performing the above-disclosed method of chemical vapor deposition, wherein four reaction chambers are included, and the material gases are supplied to the respective reaction chambers in accordance with the following gas supply sequences: Chamber 1: $TMG+H_2/H_2$ (for gas replacement)/$AsH_3+H_2/H_2$ (for gas replacement); Chamber 2: $H_2$ (for gas replacement)/$AsH_3+H_2/H_2$ (for gas replacement)/$TMG+H_2$; Chamber 3: $AsH_3+H_2/H_2$ (for gas replacement)/$TMG+H_2/H_2$ (for gas replacement); Chamber 4: $H_2$ (for gas replacement)/$TMG+H_2/H_2$ (for gas replacement)/$AsH_3+H_2$.

2 Claims, 8 Drawing Sheets

31 ~ 34 : GROWTH-CHAMBER

311 ~ 314 : SOURCE GAS INTRODUCTION VALVE

331 ~ 334 : H₂ GAS INTRODUCTION VALVE

101 : SEMICONDUCTOR SUBSTRATE
102 : GROWTH CHAMBER
103 : SUSCEPTOR
104 : GAS INTRODUCTION PIPE
105 : HEATING COIL
106 : GAS EXHAUST PIPE

S/L=2.44

S/L=3.24

S/L=8.27

SHADED PORTION: OPENING PORTION (GaAs)
S: AREA OF OPENING PORTION
L: PERIPHERAL LENGTH OF OPENING PORTION

21 : TMG SUPPLY SOURCE (GROUP III MATERIAL)

22 : ARSINE GAS SUPPLY
     SOURCE (GROUP V MATERIAL)

23 : SUBSTRATE

24 : SUSCEPTOR

25 : VACUUM PUMP

26 : HEATING COIL 27, 28 : GAS INTRODUCTION PIPE

29 : GROWTH CHAMBER 201,202 : SOURCE GAS INTRODUCTION VALVE

211~213 : VENT LINE VALVE

METHOD FOR PRODUCING COMPOUND SEMICONDUCTORS AND APPARATUS THEREFOR

BACKGROUND OF THE INVENTION

1. Field of the Invention

The present invention relates to a method of selective chemical vapor deposition for forming thin films and an apparatus for carrying out the selective chemical vapor deposition, and particularly to chemical vapor deposition of semiconductor single-crystal films at mask opening portions in mask-patterned substrates to be processed.

2. Description of the Prior Art

Development of IC is (Integrated Circuit) using compound semiconductors having excellent characteristics on high-speed processes has been actively advanced accompanying increase of information amount. Currently, the gate length of GaAs MOSFET IC which is one of the main elements of the compound semiconductor IC has about 1 μm rule in products.

However, it is necessary to realize elements having better characteristics than the present level such that with the gate length controlling the short channel effect, the parasitic resistance and capacitance should be reduced.

With respect to means of solving these problems, there has been the report on test preparation of a MOSFET LSI having construction in which a source portion 1 and a drain portion 2 are respectively formed in layers as shown in FIG. 2 by a selective chemical vapor deposition method, that is, an organometallic chemical vapor deposition (MOCVD) method (which was reported in Technical Report of Electronic Communication Society ED88-82, P-29, Haga et al.).

By using the MOCVD method, impurity diffusion in the horizontal direction can be reduced around the gate and the short channel effect can be controlled as compared with an LSI of a conventional construction as shown in FIG. 1. Moreover, since the contact regions to electrodes are formed by the so-called epitaxial growth method, it is possible to carry out high density doping therein, thus the parasitic resistance of the regions can be reduced.

However, in the selective chemical vapor deposition method by such a conventional MOCVD method, since the growth rate greatly depends on the ratio of the area (S) and the peripheral length (L) of an opening portion, in other words, the ratio of the area of the opening portion consisting of GaAs and the area of the masking member or the gate member, it is very difficult to control the film thickness uniformly over all openings on the substrate.

Further, there is the problem that the range of the growth condition so as to suppress the generation of polycrystalline particles on the mask portion et al. is relatively narrow.

To solve these problems in the prior art, for example, a dummy pattern is arranged on each region of a relatively wide mask portion in a mask pattern to control the film thickness uniform by adjusting constantly the ratio of the areas of growth portions and mask portions all over the substrate.

However, by arranging the dummy pattern, capacitance of wiring provided on the N+GaAs layer formed on a semi-insulating substrate is so increased that the required high-speed characteristic can not be obtained.

Furthermore, to control the deposition of such polycrystalline particles on the mask member and the like even when the dummy pattern is provided, the ratio of the supply amount between a Group III and a Group V materials, pressure and temperature for the growth must be precisely controlled. In such a case, it is very difficult to obtain a wide margin on the growth condition, thus the productivity can not be increased to a desirable level.

Moreover, in the selective chemical vapor deposition method based on such conventional MOCVD method, as designated by some arrows in FIG. 3, the thickness of the grown film in boundary regions between the mask portions and GaAs becomes larger than that of other regions thereof. This phenomenon is likely to cause breaking of metal wiring formed on the regions.

These problems are related to the selective chemical vapor deposition on processed substrates for chemical compound semiconductors, however, these must be also considered in case of selective chemical vapor deposition for forming dielectric waveguide channels for OEIC (Optoelectric Integrated Circuit).

SUMMARY OF THE INVENTION

It therefore is an object of the present invention to provide a method of producing compound semiconductors, which can control the short channel effect and realize high performance with small wiring capacitance thereof, and an apparatus for selective chemical vapor deposition for forming thin films of the compound semiconductors.

Accordingly, a method of selective chemical vapor deposition for forming thin films related to the present invention comprises the steps of providing a mask having a plurality of openings on a substrate, and supplying material gases alternately and successively at the respective openings of the mask on the substrate so as to selectively form films of a semiconductor, dielectric, or metal, wherein the film in each opening is grown with a supply amount of the source gas so as to sufficiently deposit them with the thickness of the monomolecular or monoatomic layer.

Moreover, each gas supply amount of the material gases is determined at the minimum value or less to obtain a film growth rate every source gas supply at which the film is sufficiently deposited with one monomolecular layer or one monoatomic layer thick at the point where there is no mask pattern.

Moreover, each gas supply amount of the material gases is determined at the minimum value to obtain a film growth rate at which the film is sufficiently deposited with the thickness of the monomolecular or monoatomic layer thick in a point which has the longest length from one point in an opening to the edge of the opening in all openings.

Moreover, each gas supply amount of the material gases is determined at a value or more to obtain a film growth rate at which the film is sufficiently deposited with the the monomolecular layer or the monoatomic layer thick in the opening which has the largest ratio defined by a ratio of the area and the peripheral length of an opening in all openings.

By the method as described above, deposition of polycrystalline particles onto an oxide film or a nitride film as the mask member provided on the substrate can be controlled by alternately supplying the Group III material and Group V material, for instance when a GaAs semiconductor film is formed.

Moreover, since the method is not based on the respective supply amounts of the Group III and V material, but on the film growth rate for saturating the monomolecular layer or monoatomic layer of each of the Group III and V materials, a ridge growth at edges of the mask pattern can be controlled.

Moreover, by controlling each gas supply amount of the material gases at the minimum value to obtain a film growth rate every gas supply cycle (for example, a group III gas is provided in one cycle, then a group V gas is supplied in the next cycle) for saturating the corresponding monomolecular layer or monoatomic layer in an opening having the maximum ratio of the opening area and the peripheral length in all the openings, the film thicknesses to be formed at all the openings of the mask pattern provided on the substrate are controlled to be substantially the same, and high quality of the films can be guaranteed. For example, when a GaAs film is formed by the chemical vapor deposition by using organo-metallic materials, such as trimethyl gallium (TMG) as a Group III material, and hydrogen-based arsine ($AsH_3$) as a Group V material, the density of carbon in the respective films is likely to be increased with enlargement of the supply amount of TMG. Therefore, to improve the purity, quality and production cost, it is necessary to minimize the supply amount of the material by using the method of the present invention.

Namely, when the method according to the present invention is applied to the production of GaAs MOSFET IC's, the short channel effect can be controlled, and it becomes possible to produce semiconductor devices having relatively small wiring capacitance as compared with the current level. Moreover, unevenness of the film formation at edges of the mask pattern can be prevented.

These and other objects, feature and advantages of the present invention will be more apparent from the following description of preferred embodiments, taken in conjunction with the accompanying drawings.

DETAILED DESCRIPTION OF THE EMBODIMENTS

Hereinafter, preferred embodiments of the present invention will be explained with reference to the drawings.

In an embodiment of the present invention, n-type GaAs is grown on a semi-insulating GaAs (100) substrate on which a mask pattern of an $SiO_2$ film having many openings is provided.

Figure 4:
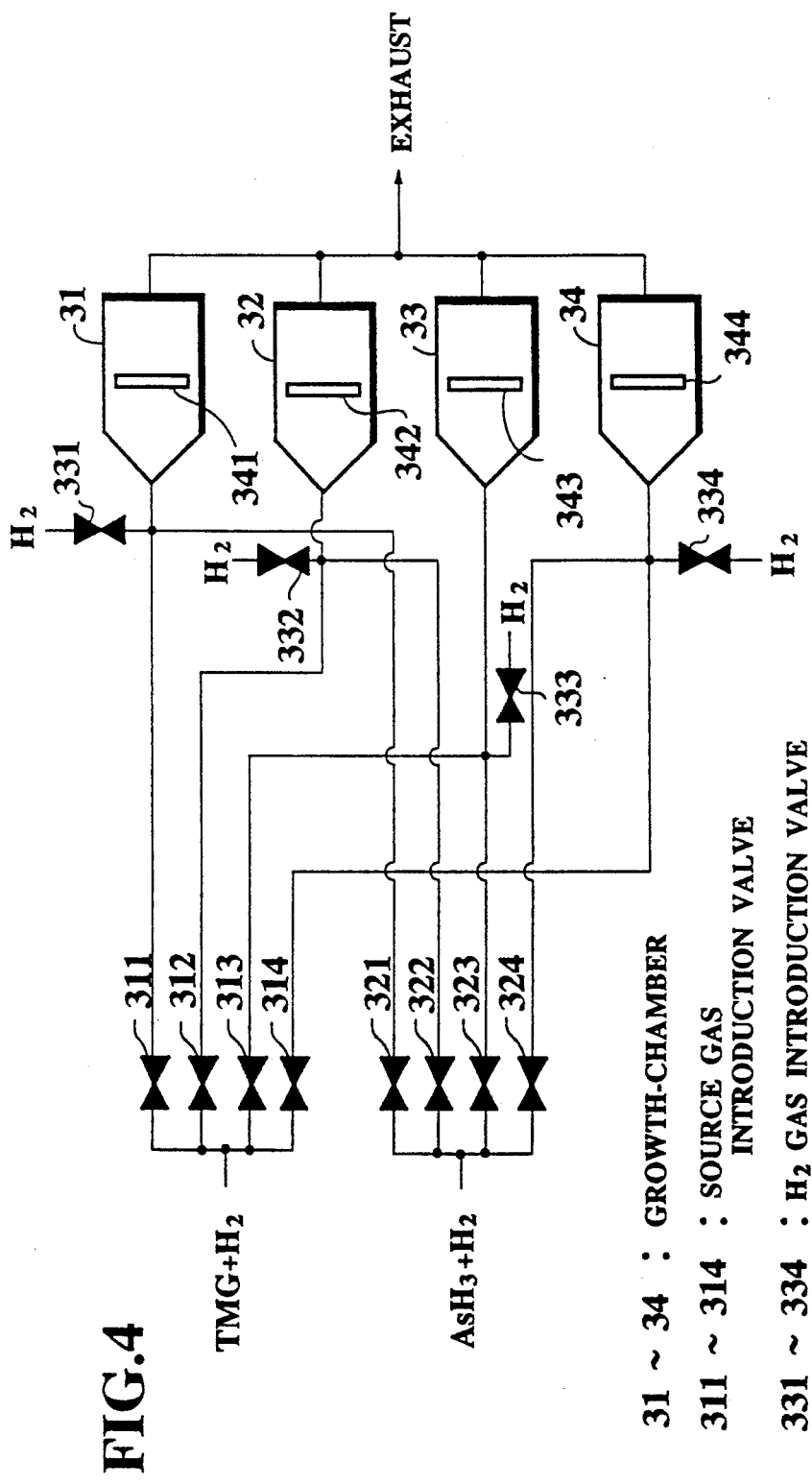
FIG. 4 is a constructional diagram of an apparatus based on a MOCVD method according to the present invention.
Figure 5:
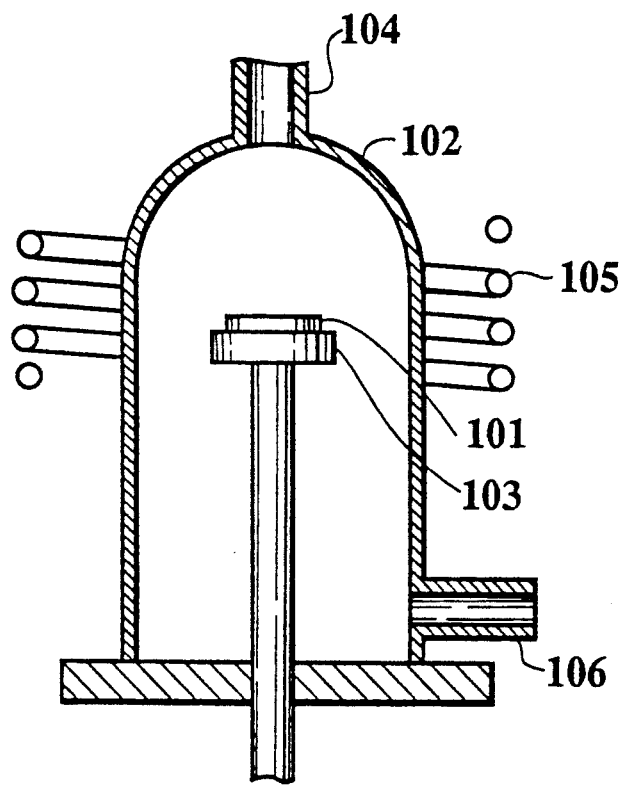
FIG. 5 is a cross section of a chamber for chemical vapor deposition in the apparatus shown in FIG. 4, FIGS. 6A to 6C are plan views to respectively show openings of a mask pattern.

FIGS. 4 and 5 show an apparatus for organometallic chemical vapor deposition (hereinafter called MOCVD apparatus) used in the present embodiment. Incidentally, the construction of the apparatus is explained in a fourth embodiment.

In the embodiment, trimethyl gallium (TMG) as a Group III material, 10% hydrogen-based arsine ($AsH_3$) as a Group V material, and 500 ppm hydrogen-based disilane ($Si_2H_6$) as a n-type impurity material were used.

Figure 6A:
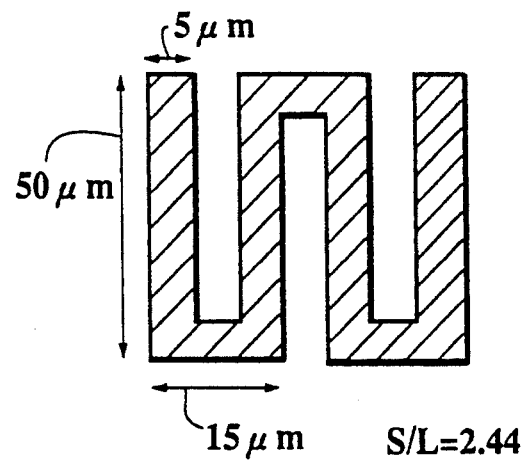
Figure 6B:
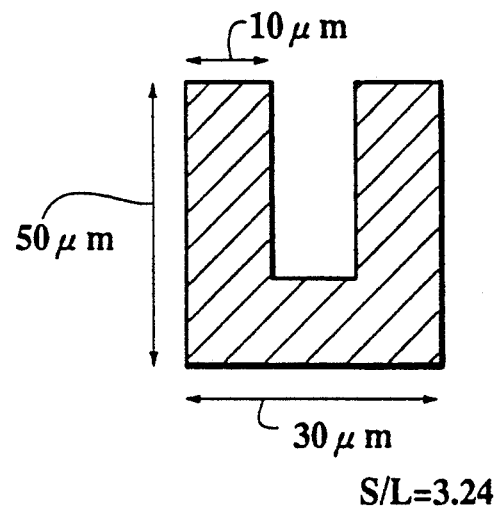
Figure 6C:
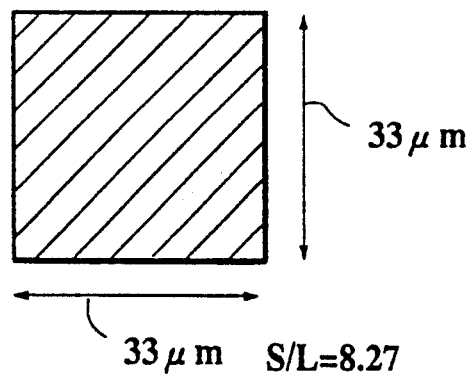

On the substrate, a mask pattern having several types of openings are provided. Among them, three types of openings are shown in FIGS. 6A to 6C (respectively expressed as portions designated by oblique lines). In the same drawings, each of values of S/L shows the ratio of the area (S) of an opening and the peripheral length (L) around the opening. These areas of the respective openings are approximately constant irrespectively of the form of the pattern forms. However, the ratios are apparently different from one another. As the mask member, a $SiO_2$ film prepared by the ordinary-pressure chemical vapor deposition was used.

First, a substrate 101 was placed on a susceptor 103 in a reaction chamber 102 for processing chemical vapor deposition operation as shown in FIG. 5, then cleaning of the surface of the substrate 101 was carried out at 670° C. in a $AsH_3$ atmosphere. Then, the process temperature was kept at 500° C., and an n-type GaAs film was formed by supplying 1000 cycles of gas supply in the order of $AsH_3$ and $H_2$ gas, $H_2$ gas, TMG and $Si_2H_6$ and $H_2$ gas, and $H_2$ gas through a gas supply inlet 104. The supply amount of 10% $AsH_3$ gas was kept at a constant value of 75 μmol/cycle. While, the supply amount of TMG was changed from 1.5 μmol/cycle to 18 μmol/cycle, further the supply amount of $Si_2H_6$ gas was set at approximately one over three (1/3) times as large as the supply amount of TMG. The pressure in the chamber 102 was kept at 10 Torr during the CVD operation.

Between the introduction of the respective material gases, only $H_2$ as a carrier gas was introduced. This process was provided for preventing mixture of the material gases in the reaction chamber 102. After the reaction, the $SiO_2$ film as the mask member was selectively removed by an ammonium fluoride solution. Then, the film thickness was measured by a stylus step detector.

Figure 7:
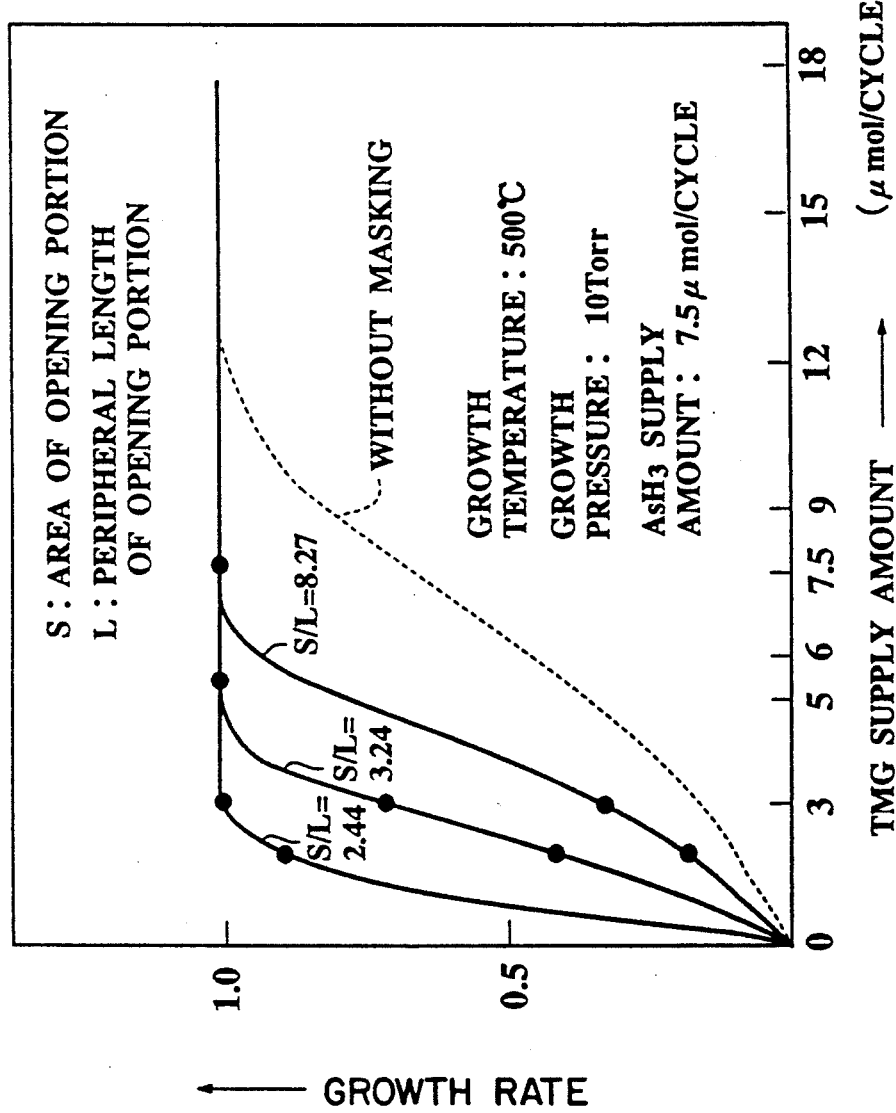
FIG. 7 is a diagram to show relationship between film growth rate and supply amount of a Group III material (TMG) every gas supply cycle in the respective openings of a mask pattern shown in FIG. 6.

FIG. 7 shows relations between the growth rate of the film and the supply amounts of TMG with respect to the three kinds of mask patterns as shown in FIGS. 6A, 6B, and 6C as parameters. Incidentally, the supply amount of $Si_2H_6$ gas was changed to be one over three (1/3) times as large as the supply amount of TMG. In this case, the growth rate is designated by the film thickness per cycle, that is, a value obtained by division of the film thickness through all the above described processes by the number of cycles (1000 cycles). Moreover, with respect to the respective openings, respective cases of three kinds of supply amounts of TMG are designated by black dots. Incidentally, a curve designated by a broken line shows the relationship between the growth rate and the supply amount of TMG when the mask pattern is not provided on the substrate.

As seen from FIG. 7, in the embodiment, when the supply amount of TMG is approximately 7.5 $\mu$mol/cycle or more, the film growth rate at every opening is 1 ML/cycle (1 ML corresponds to a monomolecular thickness of GaAs of approximately 2.83 Å).

Next, evaluation on the resultant film was carried out by using the SIMS (Secondary Ion Mass) analysis and the Raman spectroscopy analysis. As the result from the SIMS analysis, it was seen that the density of carbon was increased with enlargement of the supply amount of TMG.

Moreover, from the Raman spectroscopy analysis, it was seen that the density of carriers of electrons in the film was low in a sample in which the supply amount of TMG was 15 $\mu$mol/cycle, the value corresponding to the film growth rate for forming the monomolecular layer even when the substrate not provided with the mask was used.

The reduction of the density of electron carriers is caused probably because of the compensation effect generated by the increase of the carbon density with the increase of the supply amount of TMG.

On the other hand, with respect to a sample on which the film was formed under the condition that the supply amount of TMG was 7.5 $\mu$mol/cycle, the value corresponding to the film growth rate for forming the monomolecular layer at the opening of the ratio S/L of 8.27, the carrier density in the film was $1 \times 10^{18}$ cm$^{-3}$ all over the openings.

Namely, to obtain an n-type layer with high quality, it is preferred that the supply amount of TMG be controlled to be the minimum TMG supply amount for obtaining the film growth rate for forming the monomolecular layer all over the openings. This method is also applicable to obtain a high purity layer as well as in the case of the n-type layer.

Namely, in the embodiment where the mask pattern having the plurality of openings is used, it is necessary to decide the minimum TMG supply amount which can satisfy the film growth rate for forming the monomolecular layer all over the openings as the minimum TMG supply amount for forming the monomolecular layer at the farthest portion from the edge in all of the openings provided in the mask pattern.

Incidentally, the electron carrier density at the respective openings when the TMG supply amount was larger by 10% (8.2 $\mu$mol/cycle) than the minimum supply amount (7.5 $\mu$mol/cycle) of the TMG to obtain the film growth rate for forming the monomolecular layer or monoatomic layer was $5 \times 10^{17}$ cm$^{-3}$.

While, when the supply amount of Si$_2$H$_6$ was set at one over two (1/2) times as large as the supply amount of TMG, the electron carrier density in the film at every opening was $1 \times 10^{16}$ cm$^{-3}$ even when the supply amount of TMG was 9 $\mu$mol/cycle.

However, when the supply amount of the TMG exceeds amount larger by 10% of the TMG supply amount, since the carbon density in the film is rapidly increased, the electron carrier density can not be increased because of the above described compensation effect even when the supply amount of Si$_2$H$_6$ is increased.

Accordingly, when the n-type layer is formed, it is preferred to control the film growth rate in the range from the minimum organo-metallic material supply amount for saturating the monomolecular layer or monoatomic layer to the supply amount larger by 10% than the minimum organo-metallic material supply amount.

Moreover, when the film growth process is carried out in such a case that the plurality of openings differ from one another in the ratio (S/L) of the area (S) of each opening and the peripheral length (L) around the opening are used in the mask pattern, it is preferred that the above condition is applied to the minimum organo-metallic material supply amount to the opening having the largest ratio (S/N).

Figure 1:
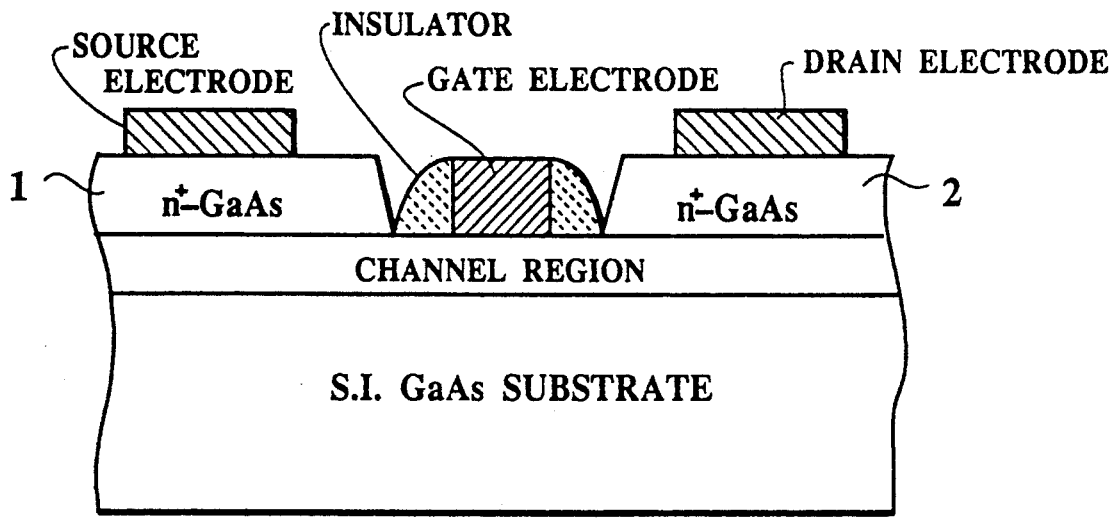
FIG. 1 is a cross section of a MOSFET formed by a conventional MOCVD method.

Besides, when the present invention is applied to selective chemical vapor deposition for forming the source region or drain region in such multi-layered composition as shown in FIG. 1, it is preferred that the respective film thicknesses are constant at all the corresponding openings, and breakage of wiring to be formed thereon can be also prevented.

On the other hand, even when the TMG supply amount was corresponding to approximately 90% film growth rate per cycle for forming the monomolecular layer or monoatomic layer (in FIG. 7, this value corresponds to 5 $\mu$mol/cycle), no wiring breakage was seen.

From these results, the range of the material supply amount is preferably the minimum material supply amount to obtain the film growth rate for starting the saturation of the monoatomic layer in the opening having the maximum ratio of the area/peripheral-length, further it is conceivable that there is no remarkable deterioration of the film quality even when the material supply amount is larger by 10% than the minimum material supply amount.

Furthermore, it is also conceivable that even when the material supply amount is corresponding to about 90% of the film growth rate for forming the monoatomic layer, there is no problem in the practical use.

Incidentally, this embodiment is described with respect to a case of the GaAs selective chemical vapor deposition on a substrate, it is conceivable that the present invention is applicable to other chemical compound semiconductors. Moreover, similar effect can be expected also in case of selective chemical vapor deposition of a IV—IV group semiconductor such as Si$_x$Ge$_{1-x}$ ($0 \leq x \leq 1$) or a film of dielectric such as Li$_x$Nb$_y$O$_3$. Namely, in case of Si$_x$Ge$_{1-x}$, when Si(CH$_3$)$_2$H$_2$, Si$_2$H$_6$ or SiH$_4$ is the Si material and Ge(CH$_3$)$_2$H$_2$, or GeH$_4$ etc. As the Ge material are alternately supplied onto a substrate provided with a mask pattern having a plurality of openings thereon in accordance with the method of the present invention, Si$_x$Ge$_{1-x}$ ($0 \leq x \leq 1$) films having almost uniform thicknesses can be selectively formed on the substrate at the openings. Furthermore, this embodiment is described in case of the chemical vapor deposition based on heat decomposition, similar effect can be expected also in case of the so-called optical excitation chemical vapor deposition where light is irradiated to material gases or a substrate to be processed.

Hereinafter, a second embodiment of the present invention will be explained, wherein n-type GaAs film is formed on a semi-insulating GaAs (100) substrate on which a mask pattern of $Si_2O_2$ having a plurality of openings is provided.

Also in the second embodiment, the MOCVD apparatus shown in FIGS. 4 and 5 is used in the same manner as described in the first embodiment. In this case, trimethyl gallium (TMG) as a Group III material, 10% hydrogen-based arsine ($AsH_3$) as a Group V material, and 1000 ppm hydrogen-based $Si_2H_6$ as a n-type impurity material were respectively used.

Moreover, hydrogen was used as a carrier gas for the respective material gases. As the substrate, a semi-insulating GaAs (100) substrate was used, and an $SiO_2$ mask pattern was so provided on the substrate that the ratios of areas of the openings and the masked portions were 0.03, 0.3, 3, and 30 respectively.

First, a substrate 101 was placed on a susceptor 103 in a reaction chamber 102, then heated at 670° C. in a $AsH_3$ gas atmosphere so as to carry out cleaning of the surface of the substrate. Next, the process temperature was decreased to 500° C., and gas supply of 1000 cycles in the order of $AsH_3$ and $H_2$ gases, $H_2$ gas, TMS and $Si_2H_6$ and $H_2$ gases, $H_2$ gas was carried out through a gas inlet 104 to form an n-type GaAs film.

With respect to the supply amount, 10% $AsH_3$ was 400 SCCM (Standard Cubic Centimeter per Minute), TMG was 1.5 SCCM, and 1000 ppm $Si_2H_6$ was 200 SCCM. While, with respect to the supply time, each of $AsH_3 + H_2$ and $H_2$ was a constant value of 2 seconds, and $TMG + Si_2H_6 + H_2$ was suitably changed. The reaction pressure was set at 20 Torr, and $H_2$ gas was so flowed that the total amount was controlled to be a constant value of 3 SLM (Standard Litter per Minutes) in the reaction.

Between the introduction of the respective material gases, only $H_2$ gas was flowed to prevent mixing of these material gases in the reaction chamber. The $SiO_2$ film in the resultant film as the mask pattern was removed with an ammonium fluoride, then the film thickness was measured by a stylus step detector.

Figure 8:
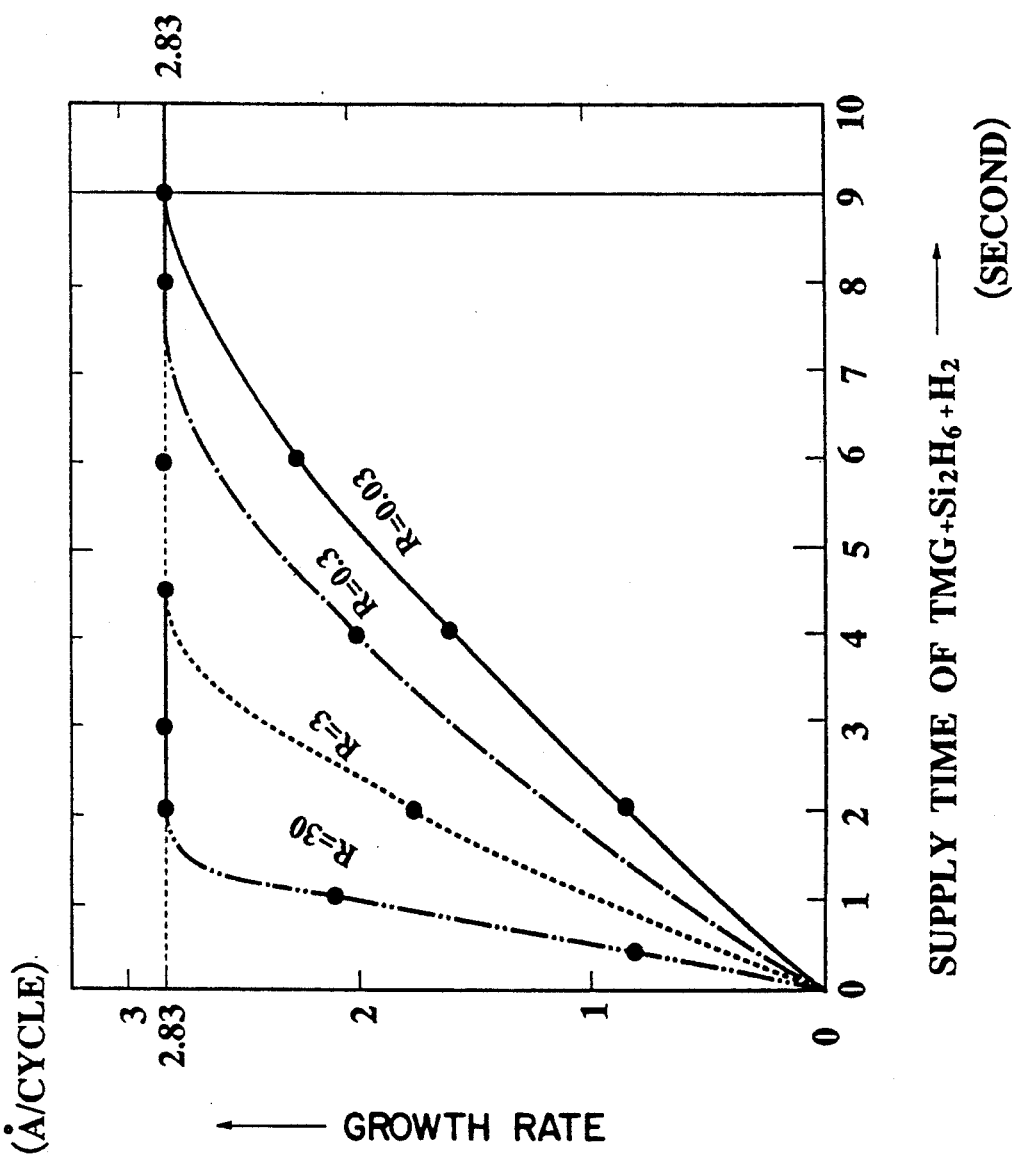
FIG. 8 is a diagram to show relationship between film growth rate and supply time of a Group III material (TMG) and an impurity material ($Si_2H_6$) every gas supply cycle based on the area ratio R of the mask pattern as parameters.

FIG. 8 shows relationship between the growth rate of the n-type GaAs film and the supply time of TMG and $Si_2H_6 + H_2$ with respect to the respective area ratios R as parameters. In this case, the film growth rate is designated by the film thickness per cycle, that is, a value obtained by division of the film thickness through all the above film forming processes by the number of cycles (it is 1000 cycles in the present embodiment). Moreover, with respect to the respective openings, respective cases of three kinds of supply amounts of TMG and $SiH_6$ are designated by black dots. From the result of measurement, in all the cases of the openings, the film thickness per cycle became a constant value of 2.83 Å at the supply time of 9 seconds or after. The thickness corresponds to the condition on which the GaAs film grows just by a single molecular layer for one cycle.

Incidentally, the film thickness per cycle never exceeded 2.83 Å irrespective of the supply time. Moreover, no deposition of polycrystal particles on the $SiO_2$ film was seen. To the contrary, uniform film formation could be seen all over the wafer.

Figure 2:
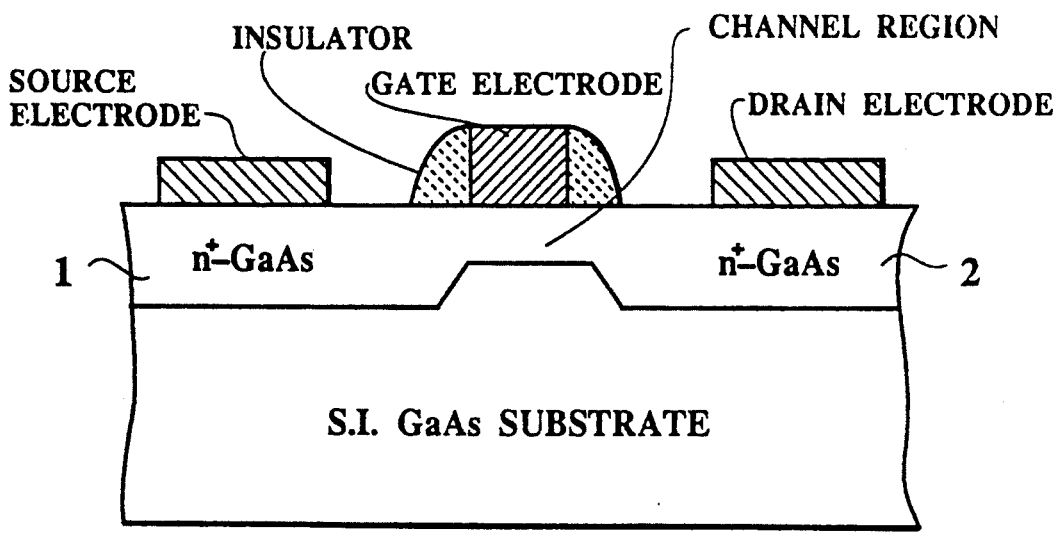
FIG. 2 is a schematic cross section of a MOSFET formed by a conventional method other than the MOCVD method.
Figure 3:
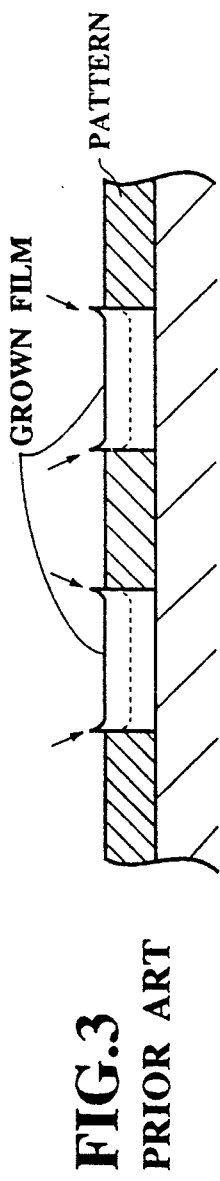
FIG. 3 is a cross section of a single-crystalline layer obtained by the conventional MOCVD method.

Next, the source portion and the drain portion of a MOSFET IC (4K SRAM, Gate length=0.5 μm) as shown in FIG. 2 (n+GaAs carrier density=$5 \times 10^{18}$ $cm^{-3}$) were respectively formed under the condition that the supply amount of $TMG + Si_2H_6 + H_2$ was 9 seconds and the other conditions were as same as that of the first embodiment. The characteristics of the MOSFET, that is, the change of threshold voltage and the K value were much improved as compared with the case where the source portion and the drain portion were respectively formed by the conventional MOCVD method. Moreover, since there was no dummy pattern, the wiring capacitance could be reduced and elements with high performance could be realized.

Incidentally, in this embodiment, though TMG and $Si_2H_6$ were supplied at the same time, it is possible to supply them separately. Also in this case, though the supply time of $TMG + Si_2H_6 + H_2$ was set at 9 seconds, it is not necessary to limit the time to 9 seconds or more. By increasing the supply amount of TMG and $Si_2H_6$, it becomes possible to reduce the supply time for obtaining the monomolecular layer irrespectively of the area ratio R. Moreover, it is also possible to reduce the supply time by using irradiation of light.

Moreover, in this embodiment, though the $SiO_2$ film was used as the mask pattern, almost similar characteristics could be obtained when a nitride film, a silicon compound film or a metal film was used as such.

Furthermore, when a silicon compound, a germanium compound, $Si_2H_6$, $SiH_6$, and $GeH_4$ respectively having alkyl group, such as methyl group and ethyl group, are used, it becomes possible to control the film growth rate constant irrespective of the area ratio of the opening and the masked portion, and carry out uniform chemical vapor deposition of Si or $Si_xGe_{1-x}$ ($0 \leq x \leq 1$).

Next, as a third embodiment of the present invention, another method of chemical vapor deposition will be explained, which is used for forming a monoatomic layer by the MOCVD method as means for precisely controlling the thickness of a crystal layer at the monoatomic layer thereof so as to prepare functional elements utilizing the quantum well structure.

When a Group III-V compound semiconductor crystal layer is formed on a substrate by alternate supply of Group III-V material gases in accordance with the MOCVD method, a hydrogen gas or an inert gas is introduced in the reaction system for replacing the material gases in order to prevent the reaction between the Group III material gas and the Group V material gas.

However, for example, when trimethyl aluminium (TMA) is used as the material gas, the organometal is likely to be attached to walls of the pipes and the reaction chamber of the apparatus, so that the material attached to these walls is likely to be in contamination with other reaction material gases. It therefore should take considerable time to carry out the cleaning with the hydrogen gas or inert gas. In the monoatomic layer forming method, a series of the Group III material supply, gas replacement, Group V material supply and gas replacement is carried out as one supply cycle so as to form the monoatomic layer for the one supply cycle.

Thus, the film growth rate is decreased in inverse proportion to the increase of the time required for gas replacement. In current monoatomic layer forming methods therefore known so far, there has been a problem that the film growth rate is very small. Accordingly, in this embodiment, it is attempted to reduce the time required for the gas replacement and improve the film growth rate of the compound semiconductors by controlling physical adsorption of the material gases to walls of the piping and the reaction chamber by heating channels from respective material supply portions to the reaction chamber at a temperature below the decomposition temperature of the material gases when the material gases are respectively supplied.

In this embodiment, trimethyl aluminium (TMA) as the Group III material, and hydrogen-based arsine ($AsH_3$) as the Group V material were used. Moreover, a hydrogen gas as the replacement gas or carrier gas for the Group III and the Group V material, and a semi-insulating GaAs substrate (100) as the substrate were used.

Figure 9:
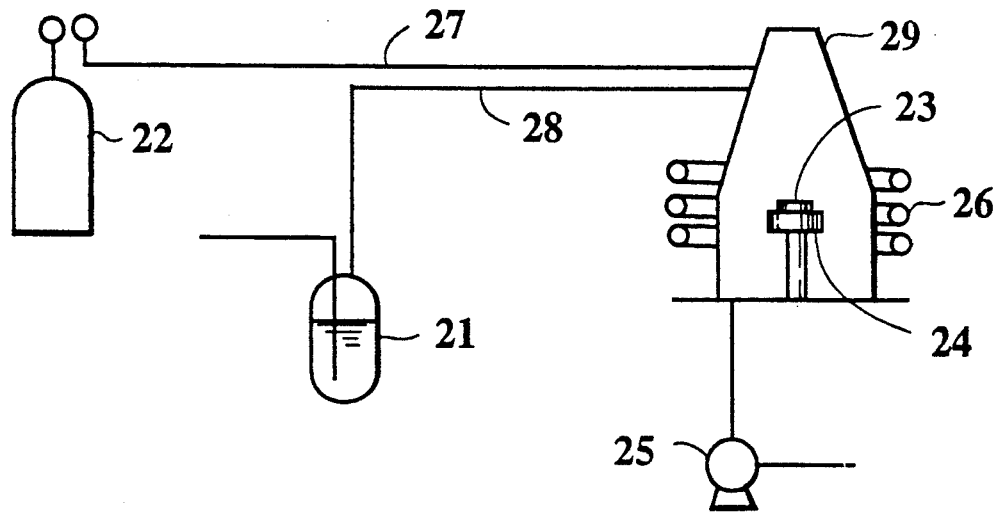
FIG. 9 is a cross section of an apparatus based on a MOCVD method of a third embodiment for forming function elements in which the quantum well structure is utilized.

Then, as shown in FIG. 9, a substrate 23 was placed on a susceptor 24 in a reaction chamber 29 of a MOCVD apparatus of this embodiment. Then, the pressure in the reaction chamber 29 was controlled at 20 Torr by a vacuum pump 25 connected to an exhaust pipe 10. Thereafter, 10% hydrogen-based arsine was supplied into the reaction chamber 29 at 250 SCCM through a gas introduction pipe 27 from an arsine gas supply source 22, and the temperature of the substrate 23 was elevated to 700° C. by a heating coil 26, then the surface of the substrate 23 was processed for 20 minutes. Subsequently, the temperature of the substrate 23 was decreased to 500° C., and walls of the arsine gas introduction pipe 27, TMA introduction pipe 28 and reaction chamber 29 were kept at 100° C. Then, the TMA was introduced for 2 seconds through the gas introduction pipe 28 from a TMA supply source 21, and gas replacement by a hydrogen gas, arsine introduction for 2 seconds, further gas replacement by the hydrogen gas were carried out as one supply cycle.

The reactions of the present embodiment were executed till 10000 supply cycles described above so as to form a GaAs crystal layer. Namely, the film forming reactions of 10000 times were carried out in every case in which the supply time of $H_2$ gas as the replacement gas is 0.1, 0.2, 0.5, 1.0, 2.0, and 4.0 seconds.

The thickness of the resultant GaAs crystal in layer in each case was a constant value of 2.83 μm. In such a manner, it was confirmed that the monomolecular layer of GaAs was formed per cycle even when the replacement time was 0.1 second.

On the other hand, when the AlAs crystal layer was formed on the GaAs substrate in the same manner as the third embodiment except that the walls of the TMA introduction pipe and the reaction chamber were not heated on the formation of the crystal layer, the monomolecular layer could be formed per cycle on condition that the time for gas replacement by $H_2$ was 2 seconds or more, however, when 1 second or less, the film growth rate exceeded the rate of forming the monomolecular layer per cycle, thus it was confirmed that the growth rate could not be suitably controlled under the condition.

Incidentally, this embodiment is applied to the formation of the AlAs crystal layer, it is also possible to apply the embodiment to formation of another Group III-V or a Group II-IV compound semiconductor crystal layer. Moreover, also in an ordinary MOCVD for supplying a Group III material and a Group V material, or a Group II material and a Group VI material at the same time, when the present invention is applied, the boundaries in the multi-layered structure can be formed very sharply.

According to the above embodiment, in the chemical vapor deposition for compound semiconductors which is capable of controlling the monoatomic layer, it becomes possible to reduce the gas replacement time, and increase the film growth rate in each compound semiconductor.

Next, an appratus for chemical vapor deposition for forming a GaAs monoatomic layer will be explained as a fourth embodiment of the present invention. First, a method of forming a GaAs monoatomic layer by using a conventional apparatus for chemical vapor deposition is explained with reference to FIG. 10.

Figure 10:
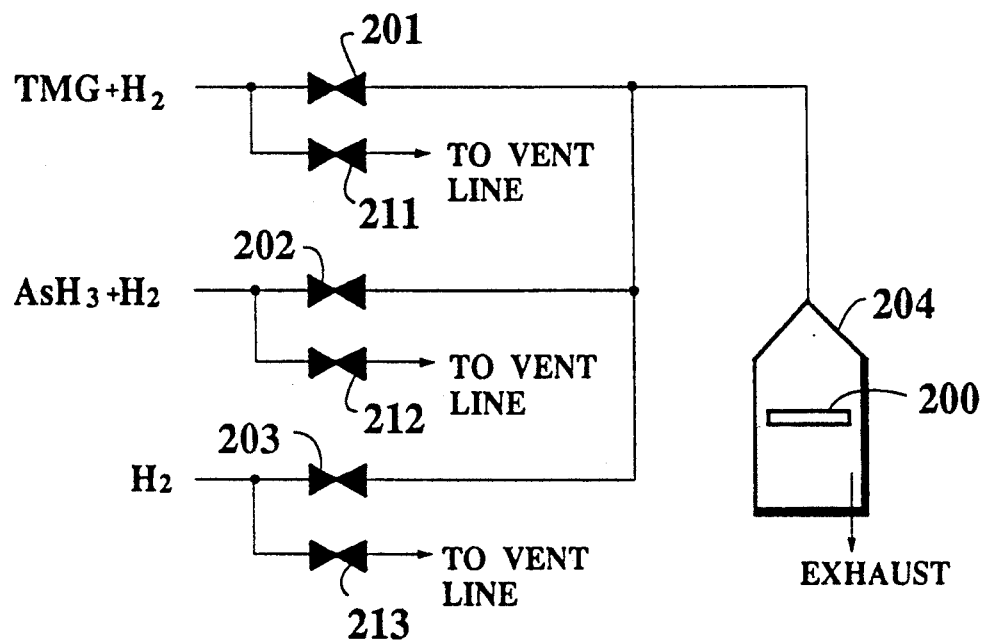
FIG. 10 is a constructional diagram of an apparatus based on a conventional MOCVD method.

FIG. 10 shows schematic construction of a conventional apparatus for chemical vapor deposition. In the conventional method of forming a GaAs monoatomic layer by using this apparatus, trimethyl gallium ($Ga(CH_3)_3$) as a gallium material gas (TMG gas) and hydrogen-based arsine ($AsH_3$) as an arsine material gas are alternately supplied with hydrogen ($H_2$) as a carrier gas into a reaction chamber 204.

In this case, to prevent contamination of these material gases in the reaction chamber 204, $H_2$ gas also used as a replacement gas is introduced into the reaction chamber 204 after every introduction of the material gases.

Accordingly, the gas supply sequence is as follows: $AsH_3$ introduction/$H_2$ introduction/TMG introduction/ $H_2$ introduction.

Then, the reaction is carried out by repeating the gas supply sequence per cycle. When $AsH_3$ gas is introduced, a valve 201 is closed and TMG flows into a vent line through a valve 211. While, when TMG is introduced, a valve 202 is closed and $AsH_3$ gas flows into a vent line through a valve 212.

Incidentally, in FIG. 10, 203 and 213 respectively show valves related to introduction of $H_2$, the valve 203 is used for introduction of $H_2$ gas, and the valve 213 is used for discharging $H_2$ gas to a vent line. Typically, it takes 2 seconds for each gas introduction, so that it takes 8 seconds for one cycle of the gas introduction sequence.

Namely, in the conventional run-and-vent method as shown in FIG. 10, it takes much time to discharge the material gases, so that the consumption efficiency of the materials is extremely bad. Hereinafter, the fourth embodiment of the present invention will be explained with reference to FIG. 4.

FIG. 4 shows an example of an apparatus for chemical vapor deposition according to the present invention. As the gallium material TMG was used, and $AsH_3$ gas as the arsine material and $H_2$ gas as the carrier gas for the materials and the replacement gas were used. In reaction chambers 31 to 34, GaAs (100) substrates 341 to 344 were respectively placed, and the temperature was kept at 500° C. by a heating device (not shown). Each one cycle of gas introduction sequences in the respective reaction chambers 31 to 34 is shown in Table 1.

TABLE 1

| Gas Introduction Sequence (One Cycle) | |
|---|---|
| Reaction Chamber | Gas Introduction Sequence |
| 31 | TMG + $H_2$ introduction/$H_2$ introduction/ $AsH_3$ + $H_2$ introduction/$H_2$ introduction |
| 32 | $H_2$ introduction/$AsH_3$ + $H_2$ introduction $H_2$ introduction/ TMG + $H_2$ introduction |
| 33 | $AsH_3$ + $H_2$ introduction/$H_2$ introduction TMG + $H_2$ introduction/$H_2$ introduction |
| 34 | $H_2$ introduction/ TMG + $H_2$ introduction $H_2$ introduction/$AsH_3$ + $H_2$ introduction |

In this case, the time for introducing each of these gases was 1 second in common. While, with respect to the supply amounts of the material gases, TMG was 0.83 SCCM and the $AsH_3$ gas was 40SCCM respectively. Moreover, the supply amounts of $H_2$ gas as the carrier gas were 80 SCCM to TMG and 360 SCCM to $AsH_3$ gas. Furthermore, the supply amount of $H_2$ gas as the replacement gas was so set as the total flow amount into the reaction chamber was 3 SLM. Besides, the pressure was set at 10 Torr.

The gas introduction sequence shown in Table 1 can be controlled by a CPU (not shown) through ON/OFF operations of air operation valves 311 to 314, 321 to 324, and 331 to 334 as shown in FIG. 4.

According to this embodiment, the consumption efficiency of the materials was much improved by always supplying any one of the material gases to the reaction chamber without discharging them through discharging lines such as vent lines. Incidentally, in this embodiment, though each time for supplying the respective materials and the replacement gas was set at the same value, it is also possible that the time differs respectively.

Various modification will become possible for those skilled in the art after receiving the teachings of the present disclosure without departing from the scope thereof.

What is claimed is:

1. A method of selective chemical vapor deposition for forming thin films, comprising the steps of:
   providing a mask having a plurality of openings on a semiconductor substrate;
   supplying material gases alternately onto the substrate so as to selectively form films of a semiconductor, dielectric or metal on the substrate at the respective openings of the mask so as to prevent from mixing the material gases with one another; and
   controlling each gas supply amount of the material gases to obtain a film growth rate for forming a corresponding monomolecular layer of the films or a monoatomic layer of the films to be formed on the substrate at the respective openings, wherein each gas supply amount of the material gases is determined in each of the following cases:
   (a) a minimum supply amount of each of said gases to obtain a film growth rate for forming the corresponding monomolecular layer at the farthest point from one end of an opening in all of the openings;
   (b) a minimum value to obtain a film forming speed for forming the corresponding monomolecular layer at the furthest point from the edge of an opening in all of the openings;
   (c) a first value to obtain the film growth rate for forming the corresponding monomolecular layer in the opening having the maximum ratio of an opening area and a peripheral length;
   (d) a second value to obtain the film growth rate for forming the corresponding monoatomic layer in the opening having the maximum ratio of the opening area and the peripheral length;
   (e) the minimum supply amount to obtain the film growth rate for saturating the corresponding monomolecular layer of each of the films;
   (f) the minimum supply amount to obtain a film growth rate for saturating the corresponding monoatomic layer of each of the films;
   (g) a third value in a range from the minimum supply amount to an amount larger by 10% than the minimum supply amount to obtain the film growth rate for saturating the corresponding monomolecular layer of each of the films;
   (h) a fourth value in a range from the minimum supply amount to an amount larger by 10% than the minimum supply amount to obtain the film growth rate for saturating the corresponding monomolecular layer of each of the films;
   (i) a fifth value in a range from the minimum supply amount to an amount smaller by 10% than the minimum supply amount to obtain the film growth rate for saturating the corresponding monomolecular layer of each of the films; and
   (j) a sixth value in a range from the minimum supply amount to an amount smaller by 10% than the minimum supply amount to obtain the film growth rate for saturating the corresponding monomolecular layer of each of the films.

2. A method of producing compound semiconductors according to claim 1, wherein
   the chemical vapor deposition is carried out by heating pipelines provided between supply sources of the respective material gases and a reaction chamber where the chemical vapor deposition is performed in such a temperature range as not to decompose the material gases.

* * * * *